United States Patent
Sato et al.

(10) Patent No.: US 7,969,553 B2
(45) Date of Patent: Jun. 28, 2011

(54) EXPOSURE DEVICE WITH MECHANISM FOR FORMING ALIGNMENT MARKS AND EXPOSURE PROCESS CONDUCTED BY THE SAME

(75) Inventors: Jin Sato, Machida (JP); Masaru Yamaga, Machida (JP)

(73) Assignee: Orc Manufacturing Co., Ltd, Tokyo (JP)

( * ) Notice: Subject to any disclaimer, the term of this patent is extended or adjusted under 35 U.S.C. 154(b) by 441 days.

(21) Appl. No.: 12/187,706

(22) Filed: Aug. 7, 2008

(65) Prior Publication Data
US 2009/0059195 A1 Mar. 5, 2009

(30) Foreign Application Priority Data
Aug. 27, 2007 (JP) ................. 2007-219250

(51) Int. Cl.
G03B 27/32 (2006.01)
G01B 11/00 (2006.01)
(52) U.S. Cl. .......................... 355/64; 356/399
(58) Field of Classification Search .......... 355/53, 355/64; 356/399; 242/364.11, 563.1
See application file for complete search history.

(56) References Cited

U.S. PATENT DOCUMENTS

| | | | | |
|---|---|---|---|---|
| 5,021,821 A * | 6/1991 | Suzuki | | 355/53 |
| 5,075,718 A * | 12/1991 | Suzuki et al. | | 355/50 |
| 5,198,857 A * | 3/1993 | Goto | | 355/53 |
| 5,585,879 A * | 12/1996 | Tahara et al. | | 396/570 |
| 6,519,036 B1 * | 2/2003 | Hickman | | 356/399 |
| 6,700,643 B2 * | 3/2004 | Mimura et al. | | 355/53 |

FOREIGN PATENT DOCUMENTS

| | | | |
|---|---|---|---|
| EP | 990612 A2 * | 4/2000 | |
| JP | 4-299332 | 10/1992 | |
| JP | 6-45406 | 2/1994 | |
| JP | 09274530 A * | 10/1997 | |
| JP | 2789539 B2 * | 8/1998 | |

OTHER PUBLICATIONS

Machine translation of JP 6-45406, published Feb. 18, 1994.*

* cited by examiner

Primary Examiner — Hung Henry Nguyen
Assistant Examiner — Steven H Whitesell-Gordon
(74) Attorney, Agent, or Firm — Berenato & White, LLC

(57) ABSTRACT

The present invention relates to an exposure device for transferring circuit patterns of a mask to a roll-film-shaped object. The exposure device includes a supply reel rotation section that is constituted by a supply reel around which the object is wound and that feeds the object by rotating the supply reel, at least one guide roller for guiding the object fed from the supply reel rotation section, an exposure stage on which the circuit patterns are transferred to the object guided by the guide roller, and an alignment mark forming section which forms, on the object, alignment marks that are used to align the mask with the object and which is positioned between the guide roller and the exposure stage.

17 Claims, 8 Drawing Sheets

33a, 33b, 353

BM1   BM2   BM3

T

AM1   AM2   AM3

M

MM1   MM2   MM3

40

AM1  MM1  AM2  MM2  AM3  MM3

EXPOSURE DEVICE WITH MECHANISM FOR FORMING ALIGNMENT MARKS AND EXPOSURE PROCESS CONDUCTED BY THE SAME

CROSS-REFERENCE TO RELATED APPLICATIONS

This application claims the benefit of Japanese Patent Application 2007-219250 filed on Aug. 27, 2007, the disclosure of which is incorporated herein by reference.

BACKGROUND OF THE INVENTION

1. Field of the Invention

The present invention relates to an exposure device which handles a roll-film tape and which is equipped with a mechanism for feeding the tape from a supply unit to a winding unit through an exposure stage. Furthermore, the present invention pertains to an exposure process to be executed by said exposure device.

2. Description of the Related Art

In order to achieve their compact and lightweight bodies, small electrical devices, such as portable phones and mobile devices, contain electronic circuit boards made of highly precise, thin film-shaped tapes (thereinafter called "tapes").

Tapes of this type have a thin, wide and very long shape. Specifically, tapes have a thickness of 0.06 mm to 0.1 mm, but some of them are 0.05 mm or less in thickness. In addition, they have a width of 100 mm to 250 mm and a length of 700 m or so. Tapes are usually treated with wound around a roll.

When electronic circuits are formed on such a roll-shaped tape, an exposure device feeds the tape to an exposure section once each block. During this process, some troubles are prone to occur, such as the tape are loosened or angled while being pulled out. In order to avoid those troubles, Japanese Unexamined Patent Application Publication H04-299332 discloses an exposure device that is able to feed a tape laterally while the tape is being handled firmly.

The above-described exposure device has sprockets, and handles the tape having perforation. The sprockets rotate while the teeth of the sprockets are inserted into the holes of perforation of the tape, so that the tape is fed to the exposure stage firmly. Also, this perforation is used to align the tape with a mask. However, all of the tapes are not provided with perforation. Accordingly, when a tape having no perforation is used, perforation needs to be formed on the tape before the exposure process. Furthermore, the perforation of the tape may be damaged when the teeth of the sprockets are inserted into the holes of the perforation. Such damaged perforation is prone to deteriorate the accuracy of the alignment process.

On the other hand, Japanese Unexamined Patent Application Publication H06-045406 discloses an exposure device that is equipped with a mechanism for forming alignment holes on a tape in order to align a mask with the tape precisely. In this exposure device, the tape on which the holes have been formed by this mechanism is positioned on the exposure stage, and is then aligned with the mask. Finally, the tape is subjected to the exposure process.

In the above exposure device, the alignment holes of the tape are formed near the exposure stage. Therefore, the mechanism for forming alignment holes is likely to spread dust. The dust may be adhered to the tape by means of static electricity, thereby leading to the deterioration of resolution of the exposed patterns.

Taking the above disadvantages into account, the present invention has been conceived. An object of the present invention is to provide an exposure device which has an ability to carry out an exposure process precisely without generating and spreading contaminants. An additional object of the present invention is to present an exposure process to be executed by said exposure device.

SUMMARY OF THE INVENTION

According to a first aspect of the present invention, there is provided, an exposure device for transferring circuit patterns of a mask to a roll-film-shaped object, comprising:

a1) a supply reel rotation section including a supply reel around which the object is wound, the supply reel rotation section for feeding the object by rotating the supply reel;

a2) at least one guide roller for guiding the object fed from the supply reel rotation section;

a3) an exposure stage on which the circuit patterns are transferred to the object guided by the guide roller; and a4) an alignment mark forming section for forming, on the object, alignment marks that are used to align the mask with the object, the alignment mark forming section being positioned between the guide roller and the exposure stage.

The exposure device of the first aspect successfully eliminates the need for a mechanism that forms alignment holes onto a tape. Instead, it forms the alignment marks on the object before an exposure step. Accordingly, this exposure device reduces the risk of generating and spreading dust or contaminants.

According to a second aspect of the present invention, there is provided, the exposure device according to the first aspect, in which the alignment mark forming section forms the alignment marks by means of UV light.

By using the UV light to form the circuit patterns on the object, the latent images of the circuit patterns on the object can be observed before they are developed.

According to a third aspect of the present invention, there is provided, the exposure device according to the first or second aspect, in which the alignment mark forming section includes an irradiation section for emitting UV light and an alignment mark mask on which an alignment mark image is printed. Moreover, the alignment marks are formed on the object through the alignment mark mask.

By using the alignment mark mask, the alignment marks can be formed on the object precisely.

According to a fourth aspect of the present invention, there is provided, the exposure device according to the first or second aspect, in which the alignment mark forming section includes an irradiation section for emitting UV light, and at least one exchangeable optical component contained in the irradiation section. Furthermore, the alignment marks are formed on the object through the optical component.

By using the optical component, the alignment marks can be formed on the object precisely as in the case of using the alignment mark mask.

According to a fifth aspect of the present invention, there is provided, the exposure device according to the third or fourth aspect, in which the irradiation section has at least one of a first structure where a plurality of LEDs for emitting the UV light are arranged and a second structure where a plurality of optical fibers guide the UV light from any of a mercury lamp and UV lasers.

In the exposure device of the third aspect, the object is exposed to light of a wavelength which is to react with a photoresist coated on the object. Hence, the exposure step can be conducted efficiently.

According to a sixth aspect of the present invention, there is provided, the exposure device according to one of the first to fifth aspects, in which the alignment mark forming section includes an edge position sensing section for sensing position of an edge of the object. In addition, the guide roller moves along a width of the object based on a sensing result of the edge position sensing section, and following this, the alignment mark forming section forms the alignment marks on the object.

In the exposure device of the sixth aspect, the guide roller moves along the width of the object, based on the sensing result of edge of the object in order to adjust the position of the object. This makes it possible for the alignment mark forming section to form the alignment marks at desired locations of the object.

According to a seventh aspect of the present invention, there is provided, the exposure device according to the third aspect, in which the alignment mark forming section includes an edge position sensing section for sensing position of an edge of the object. Moreover, the mask moves along a width of the object based on a sensing result of the edge position sensing section, and following this, the alignment mark forming section forms the alignment marks on the object.

In the exposure device of the seventh aspect, the alignment mark mask moves based on the sensing result of the edge of the object, so that the position of the alignment mark mask with respect to the object is adjusted. This makes it possible for the alignment mark forming section to form the alignment marks at desired locations of the object.

According to an eighth aspect of the present invention, there is provided, the exposure device according to the seventh aspect, in which the alignment mark mask includes a first alignment mark mask and a second alignment mark mask. Furthermore, the first and second alignment mark masks move independently of each other, based on the sensing result of the edge position sensing section.

In the exposure device of the eighth aspect, the first and second alignment mark masks allow the alignment mark forming section to form the alignment marks at desired locations of the object, even if the object is angled.

According to a ninth aspect of the present invention, there is provided, the exposure device according to the seventh aspect, in which the alignment mark mask is rotatable parallel to the object and movable along the width of the object. In addition, the alignment mark mask moves and rotates based on the sensing result of the edge position sensing section.

In the exposure device of the ninth aspect, the rotatable alignment mark mask permits the alignment mark forming section to form the alignment marks at desired locations of the object, even if the object is angled.

According to a tenth aspect of the present invention, there is provided, the exposure device according to the fourth aspect, in which the alignment mark forming section includes an edge position sensing section for sensing position of an edge of the object. Moreover, the guide roller moves along a width of the object based on a sensing result of the edge position sensing section, and following this, the alignment mark forming section forms the alignment marks.

In the exposure device of the tenth aspect, the irradiation section moves to an appropriate location with respect to the object, based on the sensing result of the position of the edge of the objection. This makes it possible for the alignment mark forming section to form the alignment marks at desired locations of the object.

According to an eleventh aspect of the present invention, there is provided, an exposure process in which circuit patterns of a mask are transferred to a roll-film-shaped object on an exposure stage. This exposure process comprises:

b1) an edge sensing step of detecting the edge position of the object;
b2) a first decision step of determining whether the object is positioned at a predetermined location or not;
b3) a roller displacement step of moving, along a width of the object, a guide roller for feeding the object to the exposure stage, if the object is determined not to be at the predetermined location in the first decision step;
b4) an alignment mark creating step of forming the alignment marks on the object, if the object is determined to be at the predetermined location; and
b5) a monitoring step of monitoring the alignment marks on the object and the circuit patterns on the mask at the same time, after the alignment mark creating step.

In the device of the eleventh aspect, the guide roller moves based on the sensing result of edge position of the object, whereby the edge position of the object is adjusted. This makes it possible for the alignment mark forming section to form the alignment marks at desired locations of the object.

According to a twelfth aspect of the present invention, there is provided, the exposure process according to the eleventh aspect, further comprising:
c1) a second decision step of determining whether or not the object is positioned at the predetermined location after the roller displacement step; and
c2) a displacement step of moving, along the width of the object, an alignment mark forming section for forming the alignment marks, if the object is determined not to be at the predetermined location in the second decision step.

In the exposure device of the twelfth aspect, the alignment mark mask or the irradiation section moves when the guide roller fails to adjust the edge position of the object. This makes it possible for the alignment mark forming section to form the alignment marks at desired locations of the object.

According to a thirteenth aspect of the present invention, there is provided, the exposure process according to the eleventh or twelfth aspect further comprising the steps of:
d1) transferring the circuit patterns of the mask to the object after the monitoring step; and
d2) feeding the object by one process area of the object by rotating the guide roller.

In the exposure device of the thirteenth aspect, the alignment mark forming step and the step of transferring the circuit patterns are done in synchronization with one another.

In conclusion, with the exposure device of the present invention and the exposure process executed by said exposure device, circuit patterns of a mask can be transferred to an object precisely without generating and spreading contaminants.

Other aspects, features and advantages of the present invention will become apparent upon reading the following specification and claims when taken in conjunction with the accompanying drawings.

BRIEF DESCRIPTION OF THE DRAWINGS

For more complete understanding of the present invention and the advantages hereof, reference is now made to the following description taken in conjunction with the accompanying drawings wherein.

DETAILED DESCRIPTION OF THE EXEMPLARY EMBODIMENTS OF THE INVENTION

Structure of Exposure Device

A description will be given below, of a projection exposure device according to an embodiment of the present invention.

Figure 1:
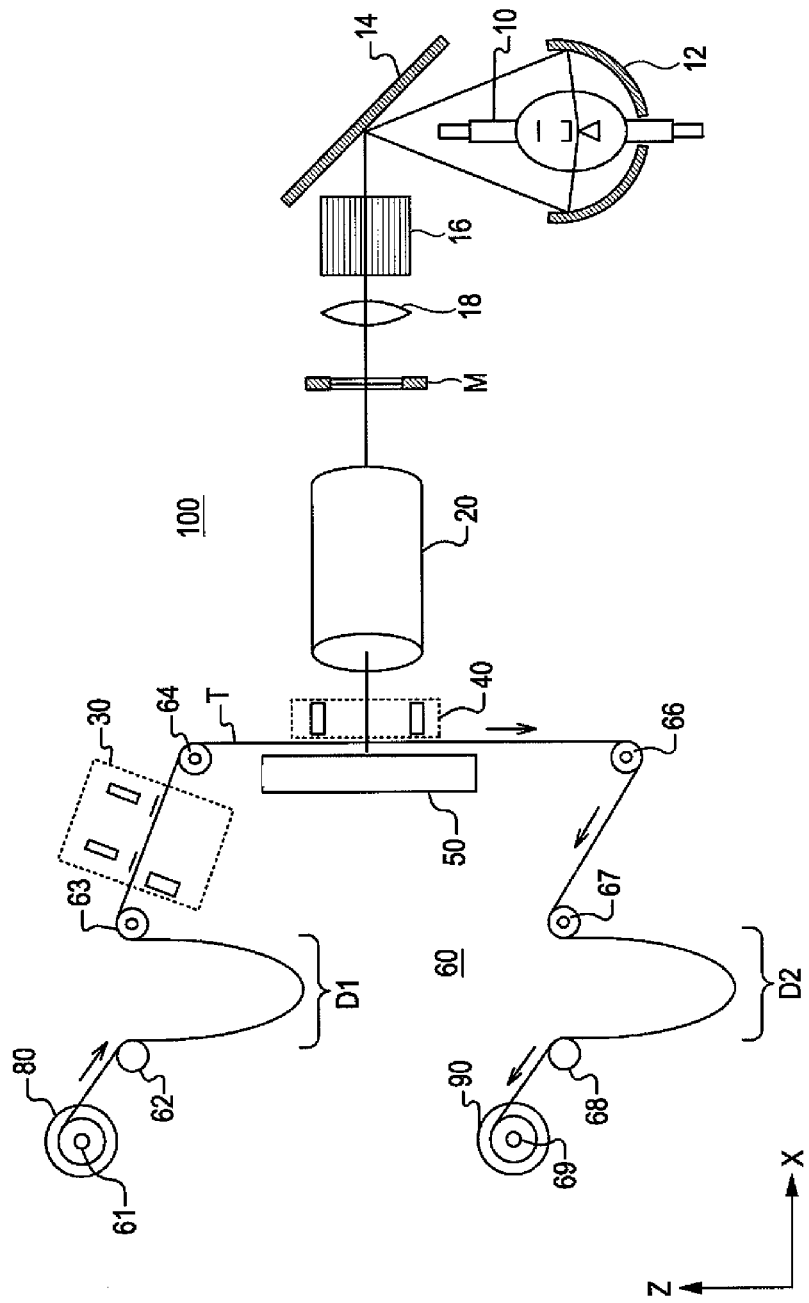
FIG. 1 is a schematic view depicting an exposure device 100 according to an embodiment of the present invention.

FIG. 1 is a schematic view of a projection exposure device 100 according to an embodiment of the present invention. The projection exposure device 100 is configured to feed a film-shaped tape T (thereinafter called "tape T") and to transfer circuit patterns of a photo mask M to the surface of the tape T.

The tape T is made of a flexible board for electronic circuit boards or a film-shaped tape material. This tape T has a thin, wide shape and, specifically, has a width of about 160 mm and a whole length of about 200 m. The tape T is wound around a supply reel rotation section 61, and it is provided with (but not limited to) perforation holes on both sides. Moreover, the tape T has a surface on which a photoresist is coated. The sensitivity of the photoresist matches with the wavelength of the light from a mercury lamp 10 (which will be described later).

The projection exposure device 100 includes an exposure stage 50 that stands in an upright position, and the tape T is fed to this exposure stage 50 once each block (or once each process area) at regular intervals. Each block of the tape T is set on the exposure stage 50, and is then irradiated with light from the mercury lamp 10 through the circuit patterns of the photo mask M.

The projection exposure device 100 includes a reflecting mirror 14, a fly eye lens 16, a condenser 18 and a projection optics system 20 in addition to the mercury lamp 10 and the photo mask M. The mercury lamp 10 emits light containing a UV ray with a wavelength of 365 nm. Note that an optical source of the exposure device 100 is not limited to the mercury lamp 10. Alternatively, the optical source may be a laser or LED, as long as it emits a UV ray. Under the mercury lamp 10 is an elliptic mirror 12, and this elliptic mirror 12 is located so as to cover the mercury lamp 10. The part of the whole light from the mercury lamp 10 is reflected by the reflecting mirror 14. Note that the light from the elliptic mirror 12 travels upward in FIG. 1, but the present invention is not limited to this configuration. Alternatively, the light from the elliptic mirror 12 may travel downward.

The fly eye lens 16 is composed of many positive lens elements that are arranged closely parallel to the optical path. Therefore, when entering the fly eye lens 16, the light is subjected to the wavefront splitting by the lens elements. Thus, the fly eye lens 16 forms multiple secondary light sources at its rear focal points, that is, close to its rear surface. In this case, the secondary light sources are as many as the lens elements of the fly eye lens 16. In other words, a substantial surface light source is formed at the rear focal point. Consequently, the fly eye lens 16 makes the density of the light from the reflecting mirror 14 uniform.

Subsequently, the light beams pass through the condenser 18, and they are overlapped and irradiated to the photo mask M. The light beams that have passed through the photo mask M are directed to the projection optics system 20. The photo mask M has at least one mask mark MM outside the circuit patterns (FIG. 8C), and this mask mark MM is used to align the photo mask M with the tape T.

The photo mask M is supported by a mask stage (not shown) in such a way that it moves perpendicular to the optical path. The projection optics system 20 can be divided into several types, including a refraction type system using lenses, a reflection type system using reflection mirrors, and refraction and reflection type system using a combination of lenses and reflection mirrors. Moreover, the magnification of the projection optics system 20 is not limited to any specific value.

The exposure stage 50 is set in such a way that the focus point of the projection optics system 20 is positioned on the surface of the exposure stage 50. The exposure stage 50 draws the tape T and fixes it thereon by means of negative pressure, and is movable on X, Y, Z and θ axes by an exposure stage driver (not shown). A focus point sensor (not shown) detects the focus image of the light on the tape T. If the focus point of the projection optics system 20 is not on the tape T, then the exposure stage driver moves the exposure stage 50 on the Z axis. As a result, the light from the projection optics system 20 is always focused on the tape T. In other words, the image of the circuit patterns formed on the photo mask M is focused on the tape T, and the circuit patterns are then transferred to the photoresist coated on the tape T.

The surface of the exposure stage 50 is positioned parallel to the portion of the tape T which is between first and second feeding rollers 64 and 66. The exposure stage 50 has, on its surface, multiple holes for drawing the tape T, and supports each block of the tape T. After the tape T is secured to the surface of the exposure stage 50, the photo mask M and the tape T are aligned with each other by using an alignment camera 40. Following the alignment, the circuit patterns of the photo mask M are transferred to the tape T. Since the surface of the exposure stage 50 is in a vertical position, the tape T comes off the exposure stage 50 due to its weight immediately after the exposure stage 50 stops drawing the tape T. Therefore, the exposure stage 50 does not need any mechanism for releasing the tape T therefrom, such as a mechanism for blowing compressed air to the exposure stage 50.

The projection exposure device 100 has a tape feeding system 60 for feeding the tape T to the surface of the exposure stage 50 (which is located on the left of FIG. 1). Furthermore, the projection exposure device 100 includes an alignment mark forming device 30 for forming alignment marks at predetermined locations of the tape T, and the alignment camera 40 located between the projection optics system 20 and the exposure stage 50.

<Structure of Tape Feeding System>

Figure 2:
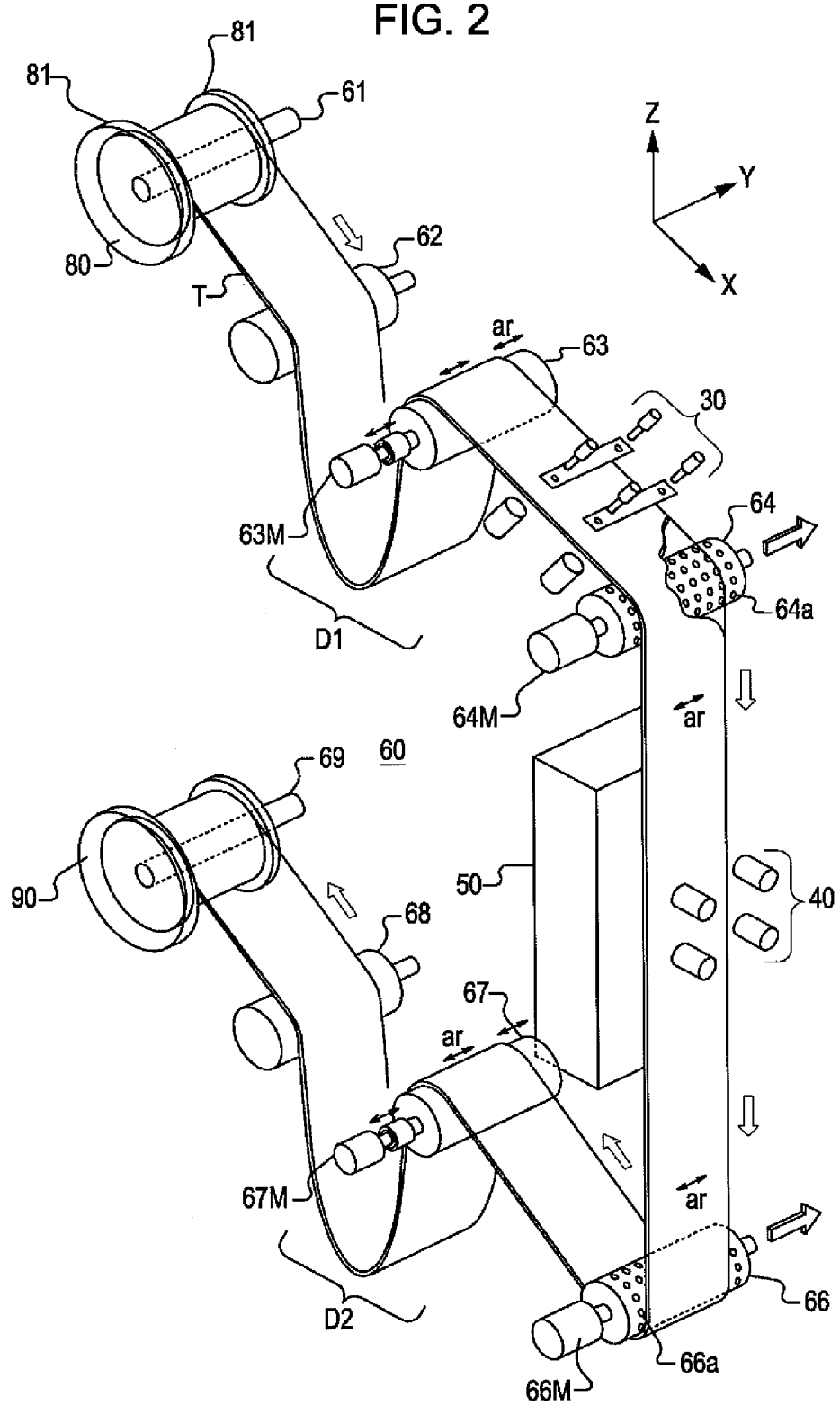
FIG. 2 is a perspective view depicting a tape feeding system 60 of the exposure device 100.

FIG. 2 is a schematic view of the tape feeding system 60 according to the embodiment of the present invention. This tape feeding system 60 includes the supply reel rotation section 61 and first and second supply side guide rollers 62 and 63. The supply reel rotation section 61 has the supply reel 80 around which the tape T is wound, and is adapted to rotate the supply reel 80. Both of the first and second supply side guide rollers 62 and 63 guide the tape T.

Moreover, the tape feeding system 60 includes first and second feeding rollers 64 and 66, first and second winding side guide rollers 67 and 68, and a winding reel rotation section 69. The first and second feeding rollers 64 and 66 are arranged over and under the exposure stage 50, respectively, and are adapted to feed the tape T. The winding reel rotation section 69 has a winding reel 90 around which the tape T is wound, and is adapted to rotate the winding reel 90. Furthermore, the projection exposure device 100 includes the supply and winding side slack absorbers D1 and D2, and they are adapted to absorb the looseness of the tape T while the tape T is being fed.

The supply reel rotation section 61 supports the bobbin-shaped supply reel 80 around which the tape T is wound, and is configured to feed the tape T. In addition, the supply reel rotation section 61 is made of a metal shaft which is to be inserted into a reel hole of the supply reel 80, and which is rotated by a drive motor (not shown). The supply reel 80 has a diameter of 750 mm for example, and is provided with flanges 81 on both sides. The tape T wound around the supply reel 80 is pulled out by the first feeding roller 64, and is fed toward the first supply side guide roller 62.

The first supply side guide roller 62 is an auxiliary roller which feeds the tape T from the supply reel 80 to the supply side slack absorber D1, and it is rotatable around its axis. This first supply side guide roller 62 is located below the supply reel rotation section 61. Thus, the tape T is fed from the supply reel rotation section 61 obliquely downward, and is hung vertically from the first supply side guide roller 62 due to its weight.

The supply side slack absorber D1 applies a predetermined tension to the tape T by hanging the tape T in a U shape. Thus, the tape T does not undergo excessive load, and is not loosened between the section 61 and the roller 62 and between the rollers 63 and 64.

The second supply side guide roller 63 feeds the tape T from the supply side slack absorber D1 to the first feeding roller 64. In addition, the roller 63 is provided with a position adjustment mechanism for displacing the tape T along the width of the tape T, that is, in the directions of an arrow "ar." This second supply side guide roller 63 is constituted by a second guide roller motor 63M, a bearing and other members.

The second guide roller motor 63M adjusts the position of the tape T by displacing it in the directions of the arrow "ar" or along the tape width, while the tape T is being fed. In addition, the second guide roller motor 63M rotates clockwise or counterclockwise in order to adjust the tension of the tape T between the rollers 63 and 64. The second supply side guide roller 63 has a surface made of buffer material such as soft resin for the purpose of absorbing slight vibrations.

The second supply side guide roller 63 configured above displaces the tape T on the Y axis by rotating the second guide roller motor 63M. This makes it possible to adjust the lateral location of the tape T in order for the alignment mark forming device 30 to create the alignment marks on the tape T precisely.

The second guide roller motor 63M of the second supply side guide roller 63 may be simply used to feed the tape T. In this case, the second supply side guide roller 63 may be provided with another motor or a linear slide mechanism for moving the tape T on the Y axis.

The first feeding roller 64 feeds the tape T from the second supply side guide roller 63 to the exposure stage 50, and it is rotated at regular intervals by the feeding motor roller 64M, so that the tape T is fed once each block. This first feeding roller 64 is provided with absorption holes 64a for drawing the tape T to the surface of the first feeding roller 64, and it is connected to a vacuum device. Consequently, the tape T is prevented from slipping on the surface of the first feeding roller 64.

The first feeding roller 64 is located below the second supply side guide roller 63 on the Z axis and directly above the exposure stage 50. As a result, the tape T is fed parallel to the surface of the exposure stage 50. The first feeding roller 64 has a roller surface made of soft resin that functions as an absorber for absorbing slight vibrations, similar to the structure of the second supply side guide roller 63.

The second feeding roller 66 is located downstream from the exposure stage 50 with respect to the feeding direction, and feeds the processed tape T to the winding side. Also, the second feeding roller 66 is directly below the first feeding roller 64 and the exposure stage 50. The structure of the second feeding roller 66 is identical to that of the first feeding roller 64 and, specifically the second feeding roller 66 includes absorption holes 66a for drawing the tape T to a surface of the second feeding roller 66.

The first winding side guide roller 67 is located downstream from the second feeding roller 66 with respect to the feeding direction, and feeds the tape T to the winding side slack absorber D2. The first winding side guide roller 67 has the same structure as that of the second supply side guide roller 63. Specifically, the first winding side guide roller 67 has a first guide motor 67M for adjusting the position of the tape T.

The second winding side guide roller 68 is an auxiliary roller that guides the tape T to the winding reel 90, and it has the same structure as that of the first supply side guide roller 62. The second winding side guide roller 68 is placed to teed the tape T from the winding side slack absorber D2 obliquely upward.

The winding reel rotation section 69 supports the winding reel 90 for winding the tape T having been processed at the exposure stage 50, and it drives a driving motor (not shown) on the axis of the winding reel 90.

<Structures of Alignment Mark Forming Device and Alignment Camera>

Referring to FIG. 2, the alignment mark forming device 30 is placed between the second supply side guide roller 63 and the first feeding roller 64. However, the present invention is not limited to this arrangement. Alternatively, the alignment mark forming device 30 may be placed between the first feeding roller 64 and the exposure stage 50.

Figure 3:
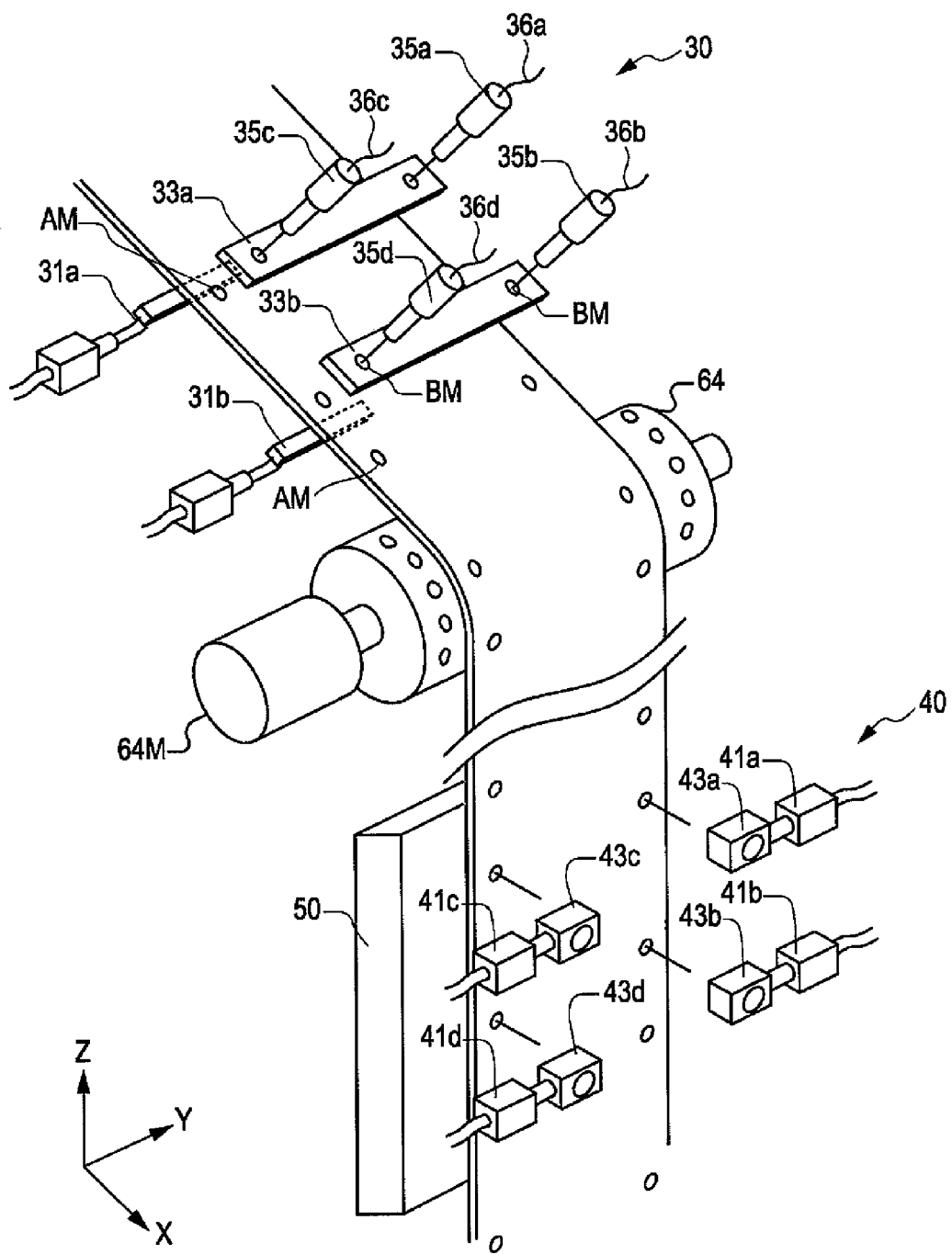
FIG. 3 is a perspective view depicting an alignment mark forming device 30 and an alignment camera 40 of the exposure device 100.

FIG. 3 is an enlarged view of the alignment mark forming device 30.

FIG. 3 is a schematic view of the alignment mark forming device 30 and the alignment camera 40 according to the embodiment of the present invention. The alignment mark forming device 30 includes first and second edge sensors 31a and 31b for sensing the edge of the tape T, first and second photo masks 33a and 33b for creating the alignment marks, and UV sources 35a, 35b, 35c and 35d. In addition, a controller 49 (see FIG. 4) for controlling the above components is provided.

Each of the first and second edge sensors 31a and 31b is composed of a line CCD, a two-dimensional camera and a CMOS camera, and it receives light that is reflected by the tape T or passes through the tape T. The first and second edge sensors 31a and 31b capture the edge portions of the tape T and, then send the captured images to the controller 49 as image signals. The controller 49 pinpoints the edge of the tape T, based on the image signals. The first and second edge sensors 31a and 31b are away from each other by a prescribed distance, because the angle of the tape T is determined. They are fixed to a frame (not shown) Those edge sensors may be replaced by a single sensor that can view the whole width of the tape T.

Each of the first and second photo masks 33a and 33b is made by creating alignment mark patterns (chrome marks SM) on a quartz glass plate with chromium, etc. Quartz glass is preferably applied to a mask material, because it has low thermal expansion coefficient and high transmittivity. Chromium possesses high adhesion to quartz glass, high light shield property for UV light, and is less prone to degradation. The first and second photo masks 33a and 33b are movable on the Y axis. In addition, the first photo mask 33a is provided for a first alignment mark having two chrome marks BM, and the second photo mask 33b is provided for a second alignment mark having two chrome marks BM. The reason why each alignment mark is composed of two marks is to make the control easier.

Each of the UV source 35a, 35b, 35c and 35d may be an LED (UV LED) for emitting a UV ray that is to react with the photoresist coated on the tape T. However, the UV sources are not limited to the LEDs. Alternatively, those UV sources may be a combination of optical fibers 36a, 36b, 36c and 36d and the mercury lamp 10 or UV lasers. The number of the UV source 35a, 35b, 35c and 35d needs to be the same as that of the chrome marks BM.

The controller 49 recognizes the position of the tape T, based on the signals from the first and second edge sensors 31a and 31b, and allows the UV sources 35a, 35b, 35c and 35d to emit UV rays, depending on the tape position. As a result, the alignment mark image that has the same shape as that of the alignment marks is created on the photoresist of the tape T. Alignment marks AM formed on the tape T are not developed yet, and they are called "latent images." Specifically, when the alignment mark images on the photoresist of the tape T are exposed to the UV rays, the color of the alignment mark images is different from the other regions of the photoresist. Consequently, the alignment mark images are identified as the alignment marks AM. The number of the alignment marks AM may be the same as that of mask marks MM formed on the photo mask M, but it needs to be two or more around one block of the circuit patterns. If the six alignment marks AM are formed, then an additional photo mask for alignment marks needs to be prepared. Alternatively, the tape T is fed by the half of each block, and the alignment marks AM are created on the tape T every time the tape T is fed.

The alignment camera 40 includes four cameras 41a, 41b, 41c and 41d, and each of them is composed of two-dimensional CCD or CMOS camera. Those alignment cameras are movable in a space between the tape T and the projection optics system 20. When the circuit patterns of the mask are transferred to the tape T, the four cameras 41a to 41d escape from the space between the tape T and the projection optics system 20. Meanwhile, when the alignment marks AM are captured, the cameras enter the space therebetween.

On the edges of the cameras 41a, 41b, 41c and 41d are prisms 43a, 43b, 43c and 43d, respectively. The light rays reflected by the alignment marks AM are reflected by the prisms 43a to 43d and are led to the cameras 41a to 41d.

Moreover, the light reflected by the mask marks MM (see FIG. 8) of the photo mask M (see FIG. 1) is reflected by the prisms 43a to 43d and is led to the cameras 41a to 41d, respectively. Thus, the camera 41a to 41d can capture the alignment marks AM of the tape T and the mask marks MM of the photo mask M at the same time.

<Control of Alignment Mark Forming Device>

Figure 4A:
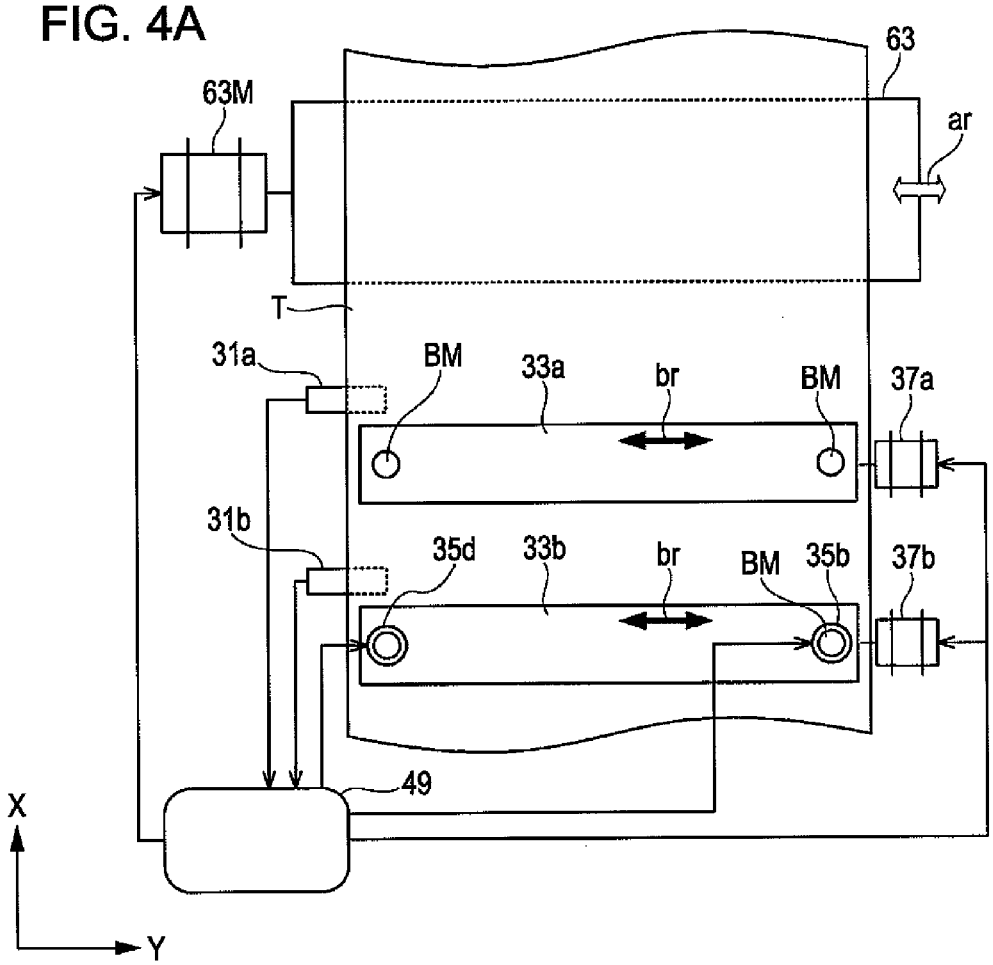
FIG. 4A is a control block of the alignment mark forming device 30.
Figure 4B:
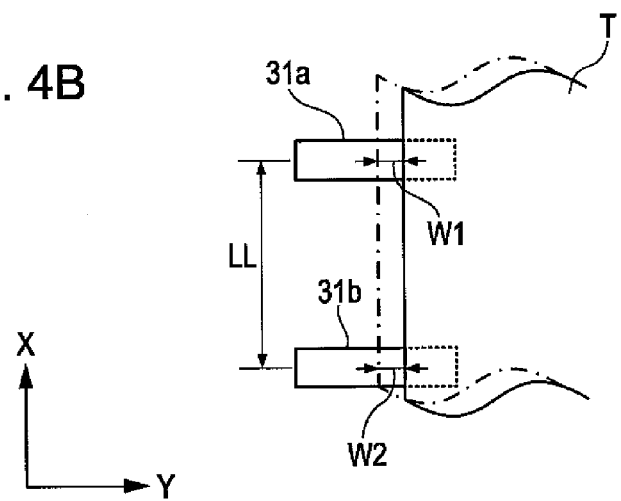
FIG. 4B is a view depicting a tape T that is shifted from a predetermined location.

FIG. 4A is a view of a control block of the alignment mark forming device 30, and FIG. 4B is a view of a case where the tape T is shifted from a predetermined location.

Referring to FIG. 4A, the controller 49 is connected to the first and second edge sensors 31a and 31b. Furthermore, the controller 49 is connected to the photo mask 33a for the first alignment mark, the photo mask 33b for the second alignment mark, and first and second mask motors 37a and 37b that move the photo masks 33a and 33b on the Y axis, respectively. Moreover, the controller 49 is connected to the UV sources 35a to 35d and the second guide roller motor 63M.

Upon receipt of the image signals from the first and second edge sensors 31a and 31b, the controller 49 determines how far the edge of the tape T is shifted from a predetermined location.

Referring to FIG. 4B, the first and second edge sensors 31a and 31b are away from each other by a distance LL on the X axis. In this drawing, the tape T is shifted from the predetermined location (denoted by a dashed line) by distances W1 and W2.

In the case of FIG. 4B, the first edge sensor 31a outputs an image signal indicating that the tape T is shifted from the predetermined location by the distance W1 on the Y axis. In addition, the second edge sensor 31b outputs an image signal indicating that the tape T is shifted from the predetermined location by the distance W2 on the Y axis. In this case, if an angle $\theta$ is considered to be substantially small, then the tape T is angled by $\theta \approx (W2-W1)/LL$.

When the tape T is shifted from the predetermined location as shown in FIG. 4B, the controller 49 sends a drive signal to the second guide roller motor 63M. Upon reception of the drive signal, the second guide roller motor 63M moves the second supply side guide roller 63 in the directions of the arrow "ar" or on the Y axis. In conjunction with this movement, the tape T moves toward the predetermined location in the directions of the arrow "ar."

However, if the tape T is considerably long, then the tape T may not move to the predetermined location no matter how much the second supply side guide roller 63 moves. In this case, the controller 49 sends drive signals to the first mask motor 37a and the second mask motor 37b. In response to those signals, the photo mask 33a for the first alignment mark and the photo mask 33b for the second alignment mark move in the directions of arrows "br."

The tape T may stay angled, although the tape T moves to the predetermined location by rotating the second supply side guide roller 63. Taking this situation into account, the first photo mask 33a for the first alignment mark and the second photo mask 33b for the second alignment mark are implemented by independent members. Specifically, the first and second photo masks 33a and 33b move by different distances, whereby the chrome marks BM are positioned at desired locations on the tape T even if the tape T is angled.

Each of the first and second mask motors 37a and 37b may be replaced by an electromechanical transducer driving device such as a piezo driver. This is because the movement distance of the first and second photo masks 33a and 33b are relatively short when the tape T is shifted.

After the arrangement of the tape T and the chrome marks BM is adjusted, the controller 49 allows UV sources 35a to 35d to discharge UV rays. The alignment mark images on the photoresist of the tape T is exposed to the rays, and the exposed portions become latent images and they are recognized as the alignment marks AM.

Figure 5:
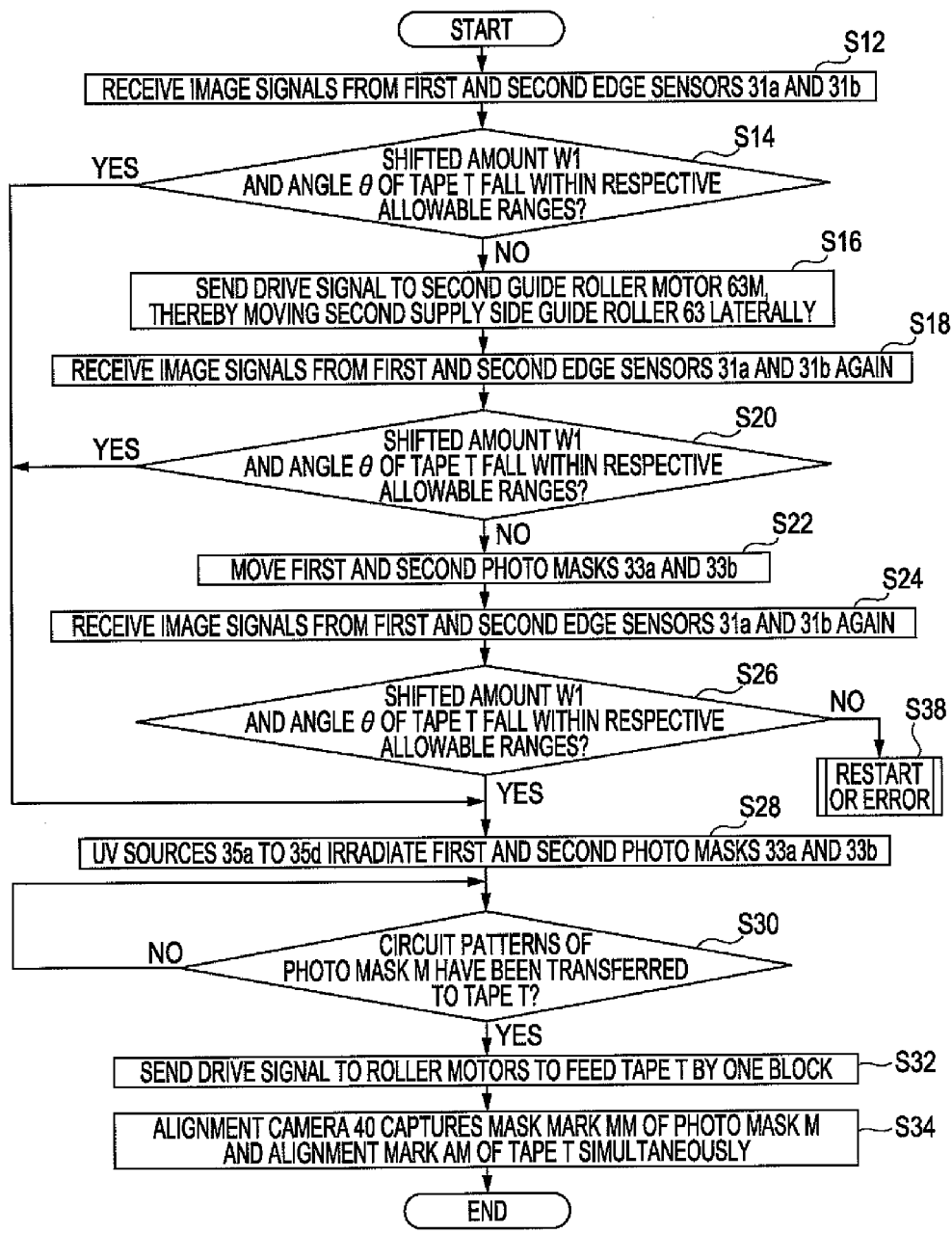
FIG. 5 is a flowchart of an operation of the alignment mark forming device 30.

FIG. 5 is a flowchart of an operation of the alignment mark forming device 30. The control operation of the alignment mark forming device 30 is performed in accordance with the following flow.

At a step S12, the controller 49 receives the image signals from the first and second edge sensors 31a and 31b. Subsequently, the controller 49 determines the sifted amount W1 and angle θ of the tape T, based on the received signals.

At a step S14, the controller 49 determines whether or not the shifted amount W1 and angle θ of the tape T fall within respective allowable ranges. If they are within the allowable ranges ("Yes" at the step S14), then the process proceeds to a step S28. Otherwise ("No" at the step S14), the process proceeds to a step S16.

At the step S16, the controller 49 sends a drive signal to the second guide roller motor 63M, thereby moving the second supply side guide roller 63 along the width of the tape T. The rotational amount of the second guide roller motor 63M is determined, based on a distance between the rollers 63 and 64 and a relative position thereof on the Y axis.

At a step S18, the controller 49 receives the image signals from the first and second edge sensors 31a and 31b again. Then, is the controller 49 determines the shifted amount and angle θ of the tape T along the width of the tape T, based on the received signals. As a result, the controller 49 can determine a relationship of the movement amounts of the tape T and of the second supply side guide roller 63.

At a step S20, the controller 49 determines whether or not the shifted amount and angle θ of the tape T fall within the respective allowable ranges. If the shifted amount and angle θ of the tape T fall within the allowable ranges ("Yes" at the step S20), then the process proceeds to the step S28. Otherwise ("No" at the step S20), the process proceeds to a step S22.

At the step S22, the controller 49 moves the first and second photo masks 33a and 33b. In this situation, the second supply side guide roller 63 has already moved by the predetermined distance, but the tape has not reached the predetermined location. Therefore, the controller 49 does not move the tape T this time, but moves the chrome marks BM. This enables the alignment marks AM to be created at right locations on the tape T.

At a step S24, the controller 49 receives the image signals from the first and second edge sensors 31a and 31b again and, then determines the shifted amount and angle θ of the tape T along the width of the tape T, based on the received signals.

At a step S26, the controller 49 determines whether or not the shifted amount and angle θ of the tape T along the width fall within the respective allowable ranges. If the shifted amount and angle θ of the tape T fall within the allowable ranges ("Yes" at the step S26), then the process proceeds to the step S28. Otherwise ("No" at the step S26), the process proceeds to a step S38.

At the step S38, this operation returns to the start or it is treated as an error. This is because the above operations fail to compensate the shifted amount and angle θ of the tape T.

At the step S28, the UV sources 35a to 35d irradiate the first and second photo masks 33a and 33b for the first and second alignment marks, respectively.

At a step S30, the controller 49 confirms whether or not the exposure step in which the circuit patterns of the photo mask M are transferred to the tape T by the projection optics system 20 has completed. If the exposure step has not completed yet ("No" at the step S30), then the controller 49 waits for the completion. Otherwise ("Yes" at the step 330), the process proceeds to a step S32.

At the step S32, because the circuit patterns have been already transferred to the tape T in the step S30, the controller 49 sends a drive signal to the roller motors in order to feed the tape T by one block. In this step, while the tape T is being fed, both the operation of the alignment mark forming device 30 and the exposure step of the projection optics system 20 work in relation to one another. This is because the looseness of the tape T is not absorbed between the alignment mark forming device 30 and the exposure stage 50. In other words, the tape T is pulled out by a predetermined tension therebetween. Accordingly, if both the operation of the alignment mark forming device 30 and the exposure step of the projection optics system 20 work separately, then the tape T can be damaged.

At a step S34, the process proceeds to a next step in which the alignment camera 40 captures the mask mark MM of the photo mask M and the alignment mark AM of the tape T simultaneously.

In the above process, when the tape T is not fed to the predetermined location, the projection exposure device 100 first displaces the second supply side guide roller 63 in order to decrease the laterally sifted amount of the tape T. Moreover, if the tape T does not yet fall within the allowable range with respect to the predetermined location, the first and second photo masks 33a and 33b displace separately. Alternatively, the second supply side guide roller 63 may be fixed, and only the first and second photo masks 33a and 33b may move. However, it is more preferable that the second supply side guide roller 63 displaces in order to decrease the shifted amount and the angle θ of the tape T. This is because the tape T finally needs to be set on the appropriate location of the exposure stage 50.

The tape feeding system 60 allows the first and second feeding rollers 64 and 66 to adjust the feeding amount of the tape T. Also, it allows the second supply side guide roller 63 and the first winding side guide roller 67 to adjust the angle of the tape T with respect to the exposure stage 50.

Consequently, the tape T is not sifted from the right location of the exposure stage 50 greatly. In other words, when the alignment marks AM and the mask marks MM are aligned with one another, the photo mask M is not displaced by a great distance. This makes it possible to increase the throughput of the exposure process and to enhance the precision of the alignment of masks.

<<First Variation>>

Next, a description will be given below, of a first variation in the alignment mark forming device 30, with reference to FIG. 6. A description of the members will be omitted below, when members of the alignment mark forming device 30 of the first variation have the same functions as those of the device 30 of the embodiment in FIG. 4.

Figure 6:
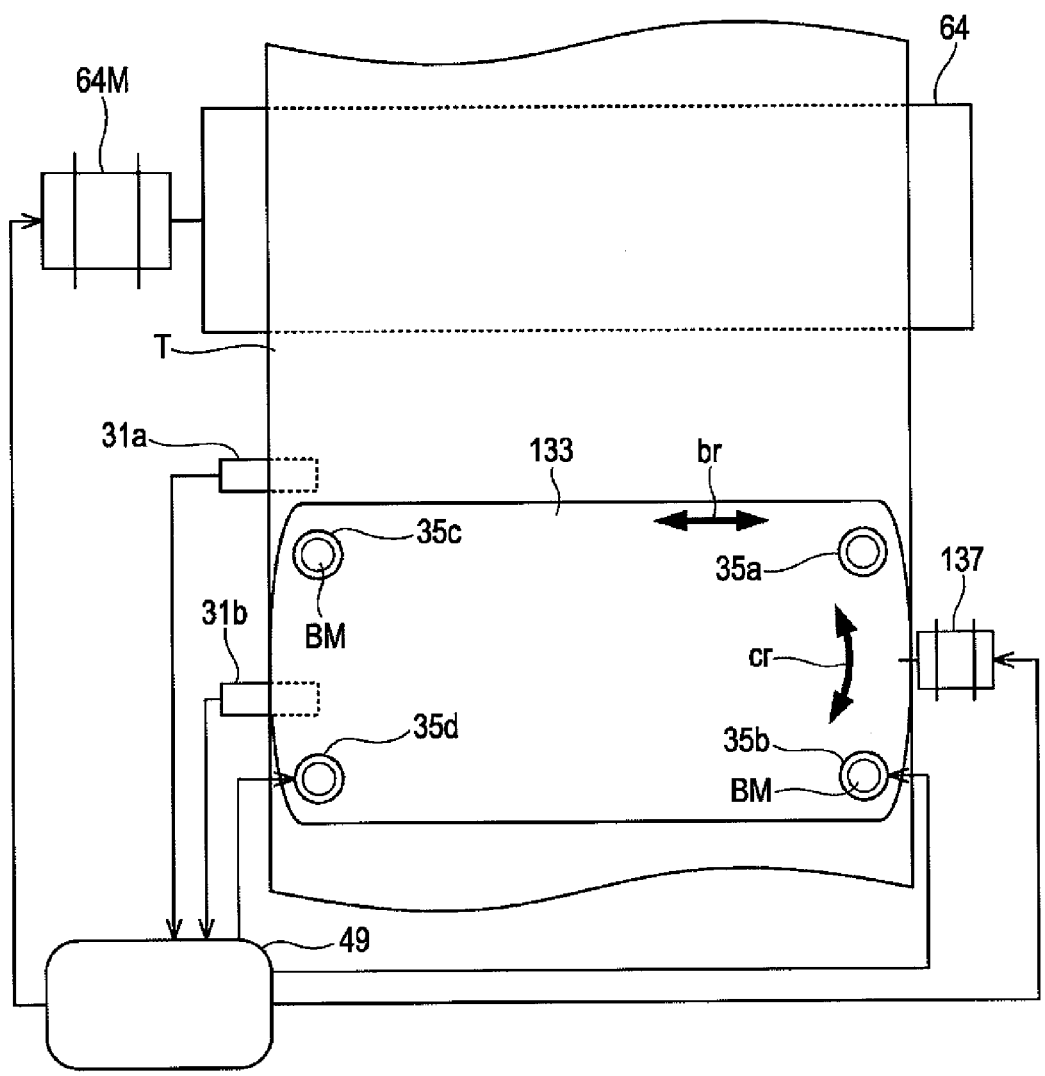
FIG. 6 is a view depicting a first variation in the alignment mark forming device 30.

FIG. 6 shows the alignment mark forming device 30 of the first variation.

The alignment mark forming device 30 of the first variation includes a photo mask 133 for alignment marks, and this photo mask 133 has a single quartz glass plate on which four alignment mark patterns (chrome marks BM) are formed. The photo mask 133 is movable on the Y axis, as well as it is rotatable while maintaining parallel to the tape T. The photo mask 133 is connected to and is operated by a mask motor 137.

Suppose a case where the tape T is shifted from a desired location on the Y axis or is angled, as shown in FIG. 4B. In this case, the photo mask 133 having the four chrome marks BM is simply displaced on the Y axis or is merely rotated. In this way, even when the tape T is angled, the chrome marks BM can be positioned on desired locations of the tape T. The arrangement of the four chrome marks BM is kept, because all the chrome marks BM are formed on the single quartz glass plate. Hence, the alignment marks can be formed on the tape T precisely.

<<Second Variation>>

Next, a description will be given below, of a second variation in the alignment mark forming device 30, with reference to FIGS. 7A and 7B. A description of the members will be omitted below, when members of the alignment mark forming device 30 of the second variation have the same functions as those of the device 30 of the embodiment in FIG. 4.

Figure 7A:
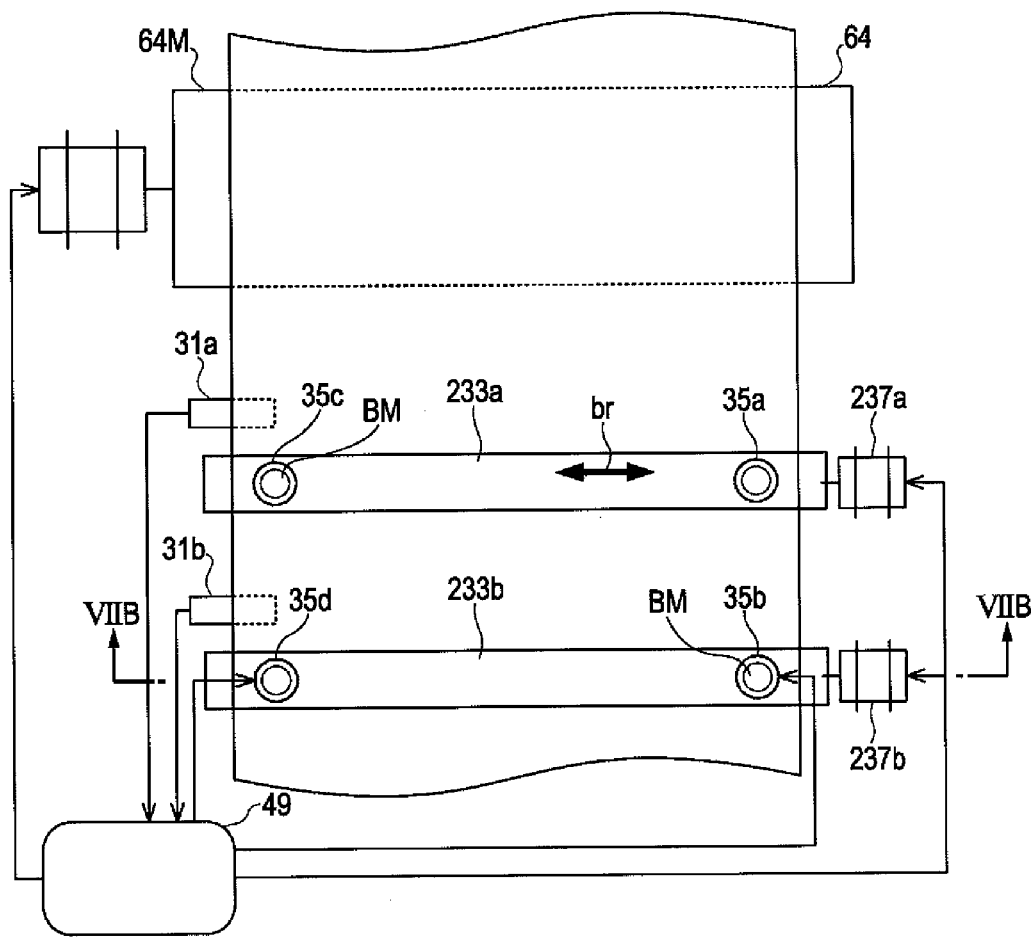
FIG. 7A is a view depicting a second variation in the alignment mark forming device 30.
Figure 7B:
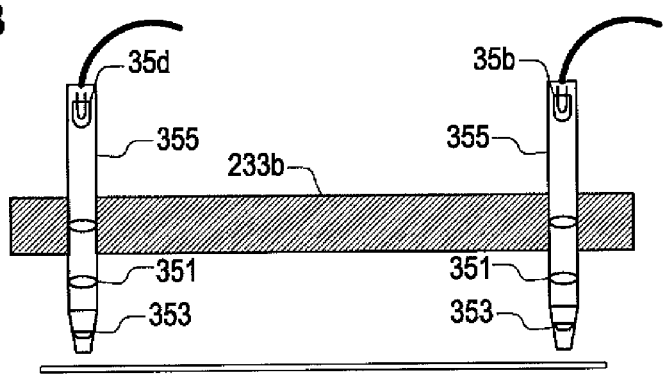
FIG. 7B is a cross-section view taken along a line of FIG. 7A.

FIGS. 7A and 7B show the alignment mark forming device 30 of the second variation.

Referring to FIG. 7A, the alignment mark forming device 30 of the second variation does not have a photo mask for alignment marks. However, it includes a first LED frame 233a with two UV-LEDs 35a and 35c and a second LED frame 233b with two UV-LEDs 35b and 35d, instead of a photo mask. The first and second LED frames 233a and 233b are connected to first and second frame motors 237a and 237b, respectively, so that they are movable on the Y axis.

FIG. 7B shows the cross-section of the second LED frame 233b. The UV-LEDs 35b and 35d are inserted into pencil-shaped cylinders 355, respectively and each of the cylinders contains optical components such as lenses and filters. A lens 351 of the optical components is exchangeable, and a preferable one is selected such that the spot size of the light beam from the UV-LED is identical to that of alignment marks AM to be formed the tape T. A mark pattern filter 353 for the alignment marks AM can be prepared optionally. This mark pattern filter 353 is also exchangeable, and the spot shape of the light beam from the UV-LED is identical to that of the alignment marks AM. Note that the first LED frame 233a has the same structure as that of the second LED frame 233b.

The alignment mark forming device 30 of the second variation is equipped with the pencil-shaped cylinders 355 instead of a photo mask for alignment marks. The size and shape of the alignment marks AM to be formed on the tape T can be changed easily by selecting the lens 351 and the mark pattern filter 353 appropriately.

<Arrangement of Alignment Marks and Mask Marks>

FIGS. 8A to 8D show examples of the alignment marks AM and of the mask marks MM.

Figure 8A:
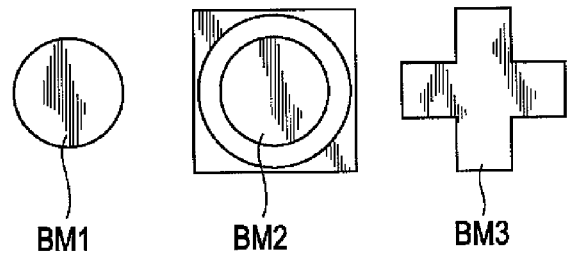
FIG. 8A is a view depicting chrome marks BM1, BM2 and BM3 on a first or second photo mask 33a, 33b or a mark pattern filter 353 of the exposure device 100.

FIG. 8A shows examples of the chrome mark BM formed on the photo mask 33a, 33b or 133 or on the mark pattern filter 353 of FIG. 7. A left mark of FIG. 8A is a first chrome mark BM1 having a circular light-shielding portion. A center mark of FIG. 8A is a second chrome mark BM2 having a ring-shaped light-shielding portion. A right mark of FIG. 8A is a third chrome mark BM3 having a cross-shaped light-shielding portion.

Figure 8B:
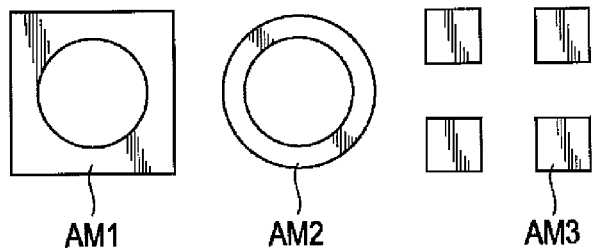
FIG. 8B is a view depicting alignment marks AM1, AM2 and AM3 on the tape T.

FIG. 8B shows examples of the alignment mark AM formed on the tape T. First, second and third alignment mark AM1, AM2 and AM3 of FIG. 5B correspond to the first, second and third chrome marks BM1, BM2 and BM3 of FIG. 8A, respectively.

Figure 8C:
FIG. 8C is a view depicting mask marks MM1, MM2 and MM3 on a mask M of the exposure device 100.

FIG. 8C shows examples of the mask mark MM of the photo mask M. Mask marks MM1, MM2 and MM3 of FIG. 5C pair up with the first, second and third alignment marks AM1, AM2 and AM3 of FIG. 5B, respectively.

Figure 8D:
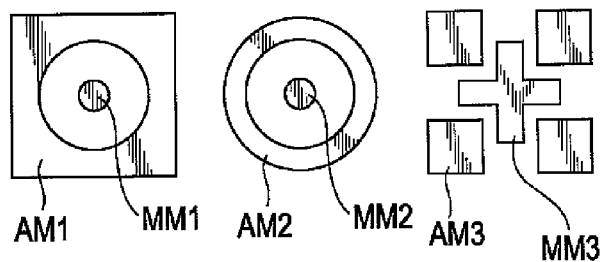
FIG. 8D is a view depicting an arrangement of the alignment marks AM1, AM2 and AM3 and the mask marks MM1, MM2 and MM3, respectively, which the alignment camera 40 captures.

As described in FIG. 3, the alignment camera 40 includes the prisms 43a, 43b, 43c and 43d. Therefore, the cameras 41a, 41b, 41c and 41d can capture the alignment marks AM of the tape T and the mask mark MM of the photo mask M at the same time. Examples of the image captured by the cameras 41a to 41d are shown in FIG. 8D.

The exposure device of the embodiment is not limited to a specific type, and it may be of any type, including contact and proximity exposure types. The exposure device 100 is very effective, when tapes with no perforations or alignment marks are subjected to an exposure process. However, it is also effective, when new alignment marks are formed on tapes that have already had perforation or alignment mark holes.

From the aforementioned explanation, those skilled in the art ascertain the essential characteristics of the present invention and can make the various modifications and variations to the present invention to adapt it to various usages and conditions without departing from the spirit and scope of the claims.

What is claimed is:

1. An exposure device for transferring circuit patterns of a mask to a roll-film-shaped object, comprising:
   a supply reel rotation section including a supply reel around which the object is wound, the supply reel rotation section for feeding the object by rotating the supply reel;
   at least one guide roller for guiding the object fed from the supply reel rotation section;
   an exposure stage on which the circuit patterns are transferred to the object guided by the guide roller; and
   an alignment mark forming section for forming alignment marks on the object by means of UV light, the alignment marks being used to align the mask with the object, the alignment mark forming section being positioned between the guide roller and the exposure stage.

2. The exposure device according to claim 1, wherein the alignment mark forming section includes an irradiation section for emitting the UV light and an alignment mark mask on which an alignment mark image is printed, and wherein the alignment marks are formed on the object through the alignment mark mask.

3. The exposure device according to claim 2, wherein the irradiation section has at least one of a first structure in which a plurality of LEDs for emitting the UV light are arranged and a second structure in which a plurality of optical fibers guide the UV light from any of a mercury lamp and UV lasers.

4. The exposure device according to claim 2, wherein the alignment mark forming section includes an edge position sensing section for sensing position of an edge of the object, and wherein the alignment mark mask moves along a width of the object based on a sensing result of the edge position sensing section, and following this, the alignment mark forming section forms the alignment marks on the object.

5. The exposure device according to claim 4, wherein the alignment mark mask includes a first alignment mark mask and a second alignment mark mask, and wherein the first and second alignment mark masks move independently of each other, based on the sensing result of the edge position sensing section.

6. The exposure device according to claim 4, wherein the alignment mark mask is rotatable parallel to the object and movable along the width of the object, and wherein the alignment mark mask moves and rotates based on the sensing result of the edge position sensing section.

7. The exposure device according to claim 1, wherein the alignment mark forming section includes an irradiation section for emitting the UV light, and at least one exchangeable optical component contained in the irradiation section, and wherein the alignment marks are formed on the object through the optical component.

8. The exposure device according to claim 7, wherein the irradiation section has at least one of a first structure in which a plurality of LEDs for emitting the UV light are arranged and a second structure in which a plurality of optical fibers guide the UV light from any of a mercury lamp and UV lasers.

9. The exposure device according to claim 7, wherein the alignment mark forming section includes an edge position sensing section for sensing position of an edge of the object, and wherein the guide roller moves along a width of the object based on a sensing result of the edge position sensing section, and following this, the alignment mark forming section forms the alignment marks.

10. The exposure device according to claim 1, wherein the alignment mark forming section includes an edge position sensing section for sensing position of an edge of the object, and wherein the guide roller moves along a width of the object based on a sensing result of the edge position sensing section, and following this, the alignment mark forming section forms the alignment marks on the object.

11. An exposure process in which circuit patterns of a mask are transferred to a roll-film-shaped object on an exposure stage, said exposure process comprising:
 an edge sensing step of detecting the edge position of the object;
 a first decision step of determining whether the object is positioned at a predetermined location or not;
 a roller displacement step of moving, along a width of the object, a guide roller for feeding the object to the exposure stage, if the object is determined not to be at the predetermined location in the first decision step;
 an alignment mark creating step of forming the alignment marks on the object by means of UV light, if the object is determined to be at the predetermined location; and
 a monitoring step of monitoring the alignment marks on the object and the circuit patterns on the mask at the same time, after the alignment mark creating step.

12. The exposure process according to claim 11, further comprising:
 a second decision step of determining whether or not the object is positioned at the predetermined location after the roller displacement step; and
 a displacement step of moving, along the width of the object, an alignment mark forming section for forming the alignment marks, if the object is determined not to be at the predetermined location in the second decision step.

13. The exposure process according to claim 12, wherein the alignment mark forming section includes an irradiation section for emitting the UV light, and an alignment mark mask on which an alignment mark image is printed, and wherein the alignment marks are formed on the object through the alignment mark mask in the alignment mark creating step.

14. The exposure process according to claim 12, wherein the alignment mark forming section includes an irradiation section for emitting the UV light and at least one exchangeable optical component contained in the irradiation section, and wherein the alignment marks are formed on the object through the optical component in the alignment mark creating step.

15. The exposure process according to claim 12, wherein the alignment mark forming section includes an irradiation section for emitting the UV light, and first and second alignment mark masks each of which has an alignment mark image thereon, and wherein the first and second alignment mark masks move independently of each other in the displacement step.

16. The exposure process according to claim 12, wherein the alignment mark forming section includes an irradiation section for emitting the UV light, and an alignment mark mask on which an alignment mark image is printed and which is rotatable parallel to the object, and wherein the alignment mark mask moves and rotates in the displacement step.

17. The exposure process according to claim 11 further comprising the steps of:
 transferring the circuit patterns of the mask to the object after the monitoring step; and
 feeding the object by one process area of the object by rotating the guide roller.

* * * * *